United States Patent
Van Rooyen et al.

(10) Patent No.: US 9,568,723 B2
(45) Date of Patent: Feb. 14, 2017

(54) ON-CHIP 4D LIGHTFIELD MICROSCOPE

(75) Inventors: Pieter Van Rooyen, San Diego, CA (US); Suzanne Hugo, Faerie Glen (ZA)

(73) Assignee: CSIR, Pretoria (ZA)

(*) Notice: Subject to any disclaimer, the term of this patent is extended or adjusted under 35 U.S.C. 154(b) by 702 days.

(21) Appl. No.: 13/883,965

(22) PCT Filed: Nov. 6, 2011

(86) PCT No.: PCT/US2011/059484
§ 371 (c)(1),
(2), (4) Date: May 7, 2013

(87) PCT Pub. No.: WO2012/061797
PCT Pub. Date: May 10, 2012

(65) Prior Publication Data
US 2013/0222547 A1  Aug. 29, 2013

Related U.S. Application Data

(60) Provisional application No. 61/410,916, filed on Nov. 7, 2010.

(51) Int. Cl.
G02B 21/36 (2006.01)
G02B 21/00 (2006.01)
A61B 5/00 (2006.01)
G03H 1/00 (2006.01)
H01L 27/146 (2006.01)
G03H 1/04 (2006.01)

(52) U.S. Cl.
CPC .......... *G02B 21/365* (2013.01); *A61B 5/0033* (2013.01); *G02B 21/0004* (2013.01); *G02B 21/367* (2013.01); *G03H 1/0005* (2013.01); *H01L 27/1462* (2013.01); *G03H 1/0443* (2013.01)

(58) Field of Classification Search
USPC ............ 348/40; 396/326, 327; 356/436, 432
See application file for complete search history.

(56) References Cited

U.S. PATENT DOCUMENTS

| 7,751,048 B2* | 7/2010 | Yang | B82Y 30/00 356/436 |
| 7,768,654 B2* | 8/2010 | Cui | G01N 21/553 356/521 |
| 7,792,423 B2* | 9/2010 | Raskar | G02B 27/0075 250/237 R |

(Continued)

FOREIGN PATENT DOCUMENTS

WO  2009088930  7/2009

OTHER PUBLICATIONS

ISR for related PCT/US2011059484 mailed on May 8, 2012.

(Continued)

*Primary Examiner* — Paulos M Natnael
(74) *Attorney, Agent, or Firm* — Ladas & Parry, LLP

(57) ABSTRACT

The present invention extends on-chip lensless microscope systems (10), including optofluidic microscope (OFMs) and holographic imaging microscopes to incorporate computational photography principles. A LF-OFM system 10 includes at least one plasmonic lens (50) with apertures (38), at least one microfluidic channel (28), and an image sensor array (24). The system (10) is capable of generating an image through computational photography.

20 Claims, 9 Drawing Sheets

(56) References Cited

U.S. PATENT DOCUMENTS

| | | | | |
|---|---|---|---|---|
| 8,039,776 | B2* | 10/2011 | Cui | G01J 9/02 250/201.9 |
| 8,325,349 | B2* | 12/2012 | Cui | G02B 21/33 356/515 |
| 8,416,400 | B2* | 4/2013 | Cui | G01J 9/0215 356/121 |
| 8,660,312 | B2* | 2/2014 | Cui | G01B 11/2441 382/106 |
| 8,822,894 | B2* | 9/2014 | Zheng | G01J 9/00 250/201.9 |
| 9,007,433 | B2* | 4/2015 | Ozcan | G01N 15/1475 348/40 |
| 9,041,938 | B2* | 5/2015 | Zheng | B82Y 20/00 356/521 |
| 2008/0187305 | A1 | 8/2008 | Raskar et al. | |
| 2008/0266655 | A1 | 10/2008 | Levoy et al. | |
| 2010/0085566 | A1* | 4/2010 | Cunningham | G01N 21/658 356/301 |
| 2012/0014837 | A1* | 1/2012 | Fehr | B01L 3/502707 422/82.11 |
| 2013/0157351 | A1* | 6/2013 | Ozcan | G01N 21/6486 435/288.7 |
| 2013/0193544 | A1* | 8/2013 | Ozcan | B82Y 15/00 257/432 |
| 2013/0330731 | A1* | 12/2013 | Fehr | B01L 3/502707 435/6.12 |
| 2014/0133702 | A1* | 5/2014 | Zheng | G06K 9/00624 382/103 |

OTHER PUBLICATIONS

IPRP for related PCT/US2011059484 issued on May 7, 2012.
Cui, X., "Optofluidic microscopy and wavefront microscopy: Innovations in biological imaging." Thesis for the degree of Ph.D., Library deposit on Dec. 2009, pp. 1-148.
Heng, Xin, et al. "Optofluidic microscopy—a method for implementing a high resolution optical microscope on a chip," Lab Chip, Aug. 2006, vol. 6, pp. 1274-1276.
Cui, X., et al. "Lensless high-resolution on-chip optofluidic microscopes for *Caenorhabditis elegans* and cell imaging." Proc. Natl. Acad. Sci. U.S.A., 2008, 105, pp. 10670-10675.
Seo, S., et al. "Lensfree holographic imaging for on-chip cytometry and diagnostics." Lab on a Chip, 2009, 9, pp. 777-787.
Ng, Ren, et al. "Light Field Photography with a Hand-held Plenoptic Camera" Stanford Tech Report CTSR 2005-02. graphics.standford.edu,papers/1fcamera-150dpi.pdf.
Levoy, M., & Hanrahan, P. (1996) "Light field rendering." Proc. SIGGRAPH 1996, 31-42.
Isaksen, A., et al. (2000) "Dynamically reparameterized light fields." Proc. Siggraph 2000, pp. 297-306.
Levoy, M., et al. (2004) "Synthetic aperture confocal imaging." ACM Trans. on Graphics (Proc. SIGGRAPH) 23(3), pp. 825-834.
Agard, D.A. (1984) "Optical sectioning microscopy: cellular architecture in three dimensions." Ann. Rev. Biophys. Bioeng. 13, pp. 191-219.
Levoy, M. (1988) "Display of surfaces from volume data." Comp. Graphics App. 8(3), 29-37.

* cited by examiner

ON-CHIP 4D LIGHTFIELD MICROSCOPE

CROSS-REFERENCE TO RELATED APPLICATIONS

This application is the U.S. National Stage of International Patent Application No. PCT/US2011/059484 filed on Nov. 6, 2011, which claims priority from U.S. Patent Application No. 61/410,916 filed on Nov. 7, 2010, the disclosures of which are hereby incorporated by references in their entireties.

TECHNICAL FIELD

The present invention generally relates to on-chip lensless microscope systems, including optofluidic microscope and holographic imaging microscopes.

BACKGROUND ART

Affordable diagnostics is emerging as a major need for the $21^{st}$ century to ensure personal diagnostics and point of care healthcare, which is critical for both the developing countries (from the standpoint of low cost) and developed countries (considering the overwhelmed medical infrastructure due to the large aging population). With the help of modern engineering technologies, measurements and biomarker detections, critical information can be extracted and the signature of chemical marker of the disease can be observed in single drop of human fluid (blood, interstitial fluid, urine, or saliva). Since the biological samples are normally limited and concentrations of molecules of interest or proteins in samples are mostly in pmol/L range, a highly sensitive, specific, and accurate detector is essential with minimized sample volume. Microfluidic sensors or broadly lab-on-a-chip (LOC) technologies have a tremendous but unproven potential to improve the health of people in developing countries. Ever since the modern inception of LOC and microfluidic technologies around 1990, use in remote settings has been perceived as potentially one of the most powerful applications of the technology by taking advantage of its small size, low volume requirement for samples, and rapid analysis. Indeed, portable LOC devices are now beginning to be used in remote settings, as a result of developments in integrating fluid actuation, sample pretreatment, sample separation, signal amplification, and signal detection into a single device. As they stand, these devices are not yet appropriate for use in the extreme resource-poor settings of developing countries; nevertheless, these advances place the field of LOC research in a prime position to tackle the profound issue of global health, where the challenges in device designs are arguably the most demanding, and the need for new health technologies the greatest.

Yang et al., U.S. Pat. No. 7,751,048, for an Optofluidic Microscope Device, discloses a device having light transmissive regions and an optical detector that is used to image an object flowing through a fluid channel.

Ciu et al., U.S. Pat. No. 7,768,654, for an On-Chip Phase Microscope/Beam Profiler Based On Differential Interference Contrast And/Or Surface Plasmon Assisted Interference, discloses a DIC microscope and/or light field profiler based on Young's interference.

Yang et al., U.S. Pat. No. 7,751,048, for an Optofluidic Microscope Device Featuring A Body Comprising A Fluid Channel And Having Light Transmissive Regions, discloses a device that includes a fluid channel having a surface and an object such as a bacterium or virus flowing through the fluid channel while light imaging elements in the bottom of the fluid channel are used to image the object.

Fletcher et al., PCT Publication Number WO2009/088930, for a High Numerical Aperture Telemicroscopy Apparatus, discloses an imaging system consisting of a cell-phone with a camera that is used for disease diagnosis, symptom analysis and post-procedure monitoring.

Raskar et al., U.S. Pat. No. 7,792,423, for a 4D Light Field Camera, discloses a camera that acquires a 4D light field of a scene by modulating the 4D light field before it is sensed.

Within the context of optofluidics there is a need for looking at specimens in a new way.

Also within the context of optofluidics, there is a need for better resolution of the image.

Also within the context of optofluidics, there is a need for low cost, label free bio-detection since most bio-detection platforms use biomarkers that have a limited shelve life and are expensive.

Also within the context of optofluidics, there is a need for increased sensitivity to allow for fewer false negative results.

Also within the context of optofluidics, there is a need for specificity to allow for fewer false positives.

SUMMARY OF THE INVENTION

The present invention is related to a novel low cost lab-on-chip (LOC) diagnostics platform, which can be utilized broadly as point of care devices and for personal diagnostics. Specifically, the proposed invention relates to an on-chip optofluidic microscope (OFM) system that integrates plasmonic lenses, miocofluidic devices, and CMOS image sensor arrays and is capable of generating 4D images through computational photography. The proposed sensor platform can be attached to cell phones and utilize the cell phone camera for point of care devices and for personal diagnostics applications.

The present invention is able to provide solutions to the needs of optofluidics. The present invention is able to provide better resolution by improving the sampling rate (increased images per second). The present invention is able to provide low cost-label free bio-detection using standard bulk CMOS technology to enable cheap and effective bio-detection. The present invention is able to provide increased sensitivity (fewer false negative results) and specificity (fewer false positives) by having the ability to change investigation point of view and depth of filed. Most bio-samples are clustered and by having the ability to change point-of-view the present invention increases the ability to count and distinguish cells. The present invention is able to provide an on-chip lightfield optofluidic microscope (LF-OFM) system that integrates plasmonic lenses, microfluidic devices, and CMOS (complementary metal-oxide semiconductor) image sensor arrays and is capable of generating 3D images using a 4D light field through computational photography.

To address this need, the present invention extends the on-chip lensless microscope system, termed the optofluidic microscope (OFM), to incorporate computational photography principles. The OFM method utilizes simplified microfluidic flow to transport biological samples across a linear array of small apertures on a metal coated CMOS imaging sensor that is illuminated by a light source such as an LED or array of LEDs. Since the passage of a sample interrupts the light transmission through the linear array of apertures, the time-varying transmission associated with each aperture represents a line trace across the biological sample. By reconstructing these line traces from the linear array of apertures, a high resolution image of the biological sample can be reconstructed, at a resolution comparable to the aperture size. A diagonal arrangement of the linear aperture array has no impact on the OFMs resolution. To obtain an image from the OFM, the image sensor is programmed to specifically read signals from the pixels directly below the linear array of apertures. The readout rate reported in is 1.3 kHz/s. The time-varying transmission change measured through each aperture represents a line scan of a sample passing through the microfluidic channel. By stacking the line scans from the apertures together, an image of the sample can be generated.

The present invention extends the OFMs functionality and usefulness by recording and controlling the 4D lightfield captured in the OFM microscope, from here on called the lightfield optofluidic microscope (LF-OFM.) Unlike a conventional photograph, light fields permit manipulation of viewpoint and focus after the snapshot has been taken, subject to the resolution of the image sensor and the diffraction limit of the optical system. From the image captured by the LF-OFM, one can employ light field rendering to generate oblique orthographic views and/or perspective views, at least up to the angular limit of rays that have been captured. Since the LF-OFM separates image acquisition from the selection of viewpoint and focus, it can be used as a "digital viewfinder" where focus and viewing perspective can be manipulated by signal processing algorithms after the picture was taken. Applying computer vision algorithms to these selection procedures will lead to greater automation of microscope operation when analyzing a large numbers of specimens. Since microscopes normally record orthographic imagery, perspective views represent a new way to look at specimens. In addition, adaptive depth of field and spatial (perspective) views of the specimen increases sensitivity (fewer false negative results) and specificity (fewer false positives).

Starting from a captured light field, one can alternatively use synthetic aperture photography to produce views focused at different depths. The ability to create focal stacks from a single input image allows moving or light sensitive specimens to be recorded. Finally, by applying 3D deconvolution to these focal stacks, one can reconstruct a stack of cross-sections, which can be visualized using volume rendering.

One novel aspect of the present invention is increasing the distance between the aperture array and the image sensor, which is needed to increase the spatial and angular resolution of the LF-OFM since more pixels require illumination by the incoming light.

Another aspect of the present invention is in contrast to the OFM system, where the individual pixel underneath the aperture array is read, the present invention reads an array of pixels, called a tile, to capture the 4D lightfield of the biological specimen flowing in the microfluidics channel. Each tile is read out at a high rate. By stacking the tile scans from the apertures together, a 4D lightfield image of the sample is generated.

Yet another aspect of the present invention is for high volume production by wafer level processing of the LF-OFM system (as opposed to using a packaged single image sensor).

Yet another aspect of the present invention is a mechanism to allow for disposable microfluidic chips to be inserted into the LF-OFM system to enable detection of different diseases using the same LF-OFM platform.

Yet another aspect of the present invention is a system that performs parallel image processing, where different layers of samples are imaged separately to increase the throughput of the system.

Yet another aspect of the present invention is applying automated computer image recognition algorithms to the 4D lightfield picture to identify cells (such as matched filtering, binary image processing, moment calculations and pattern classification), in order to perform diagnostics in remote areas that are served by cellular networks.

Yet another aspect of the present is a method. The method begins by recording and controlling the 4D lightfield captured in an optofluidic microscope. The method also includes capturing light fields permit manipulation of viewpoint and focus after the snapshot has been taken. The method also includes employing light field rendering to generate oblique orthographic views and/or perspective views. The method also includes applying computer vision algorithms to the lightfield image to provide greater automation of microscope operation when analyzing a large numbers of specimens. The method also includes adaptive depth of field and spatial (perspective) views of the specimen increases sensitivity (fewer false negative results) and specificity (fewer false positives).

BRIEF DESCRIPTION OF THE DRAWINGS

FIG. 1B is a top plan view of a LF-OFM system.

BEST MODE(S) FOR CARRYING OUT THE INVENTION

Figure 1:
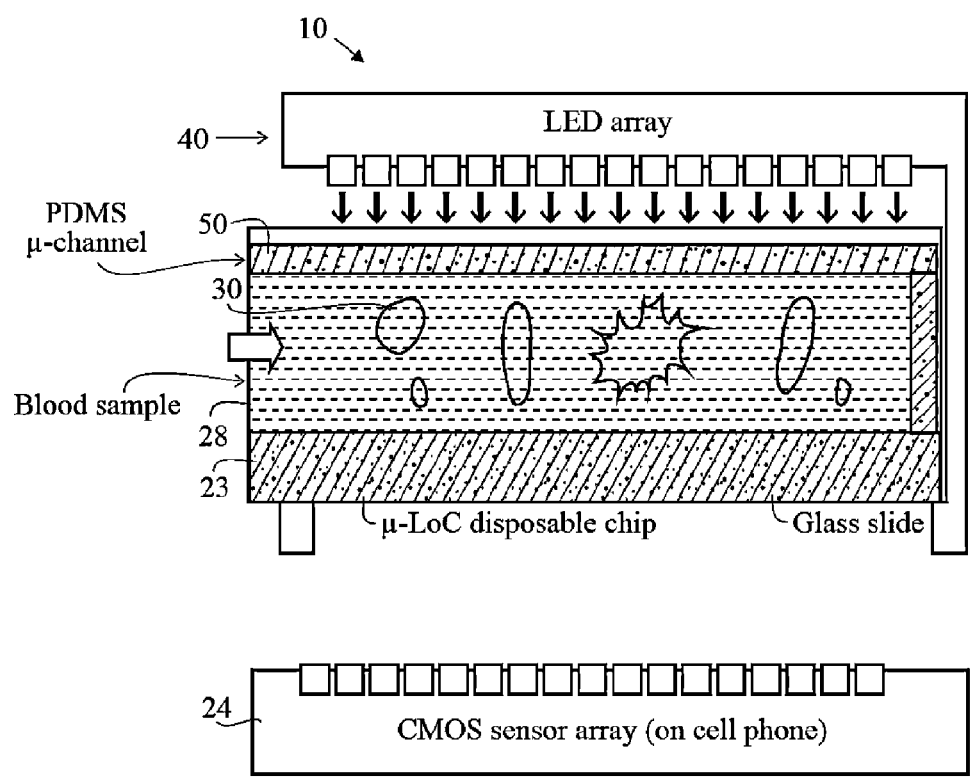
FIG. 1 is a schematic diagram of a LF-OFM system.
Figure 1A:
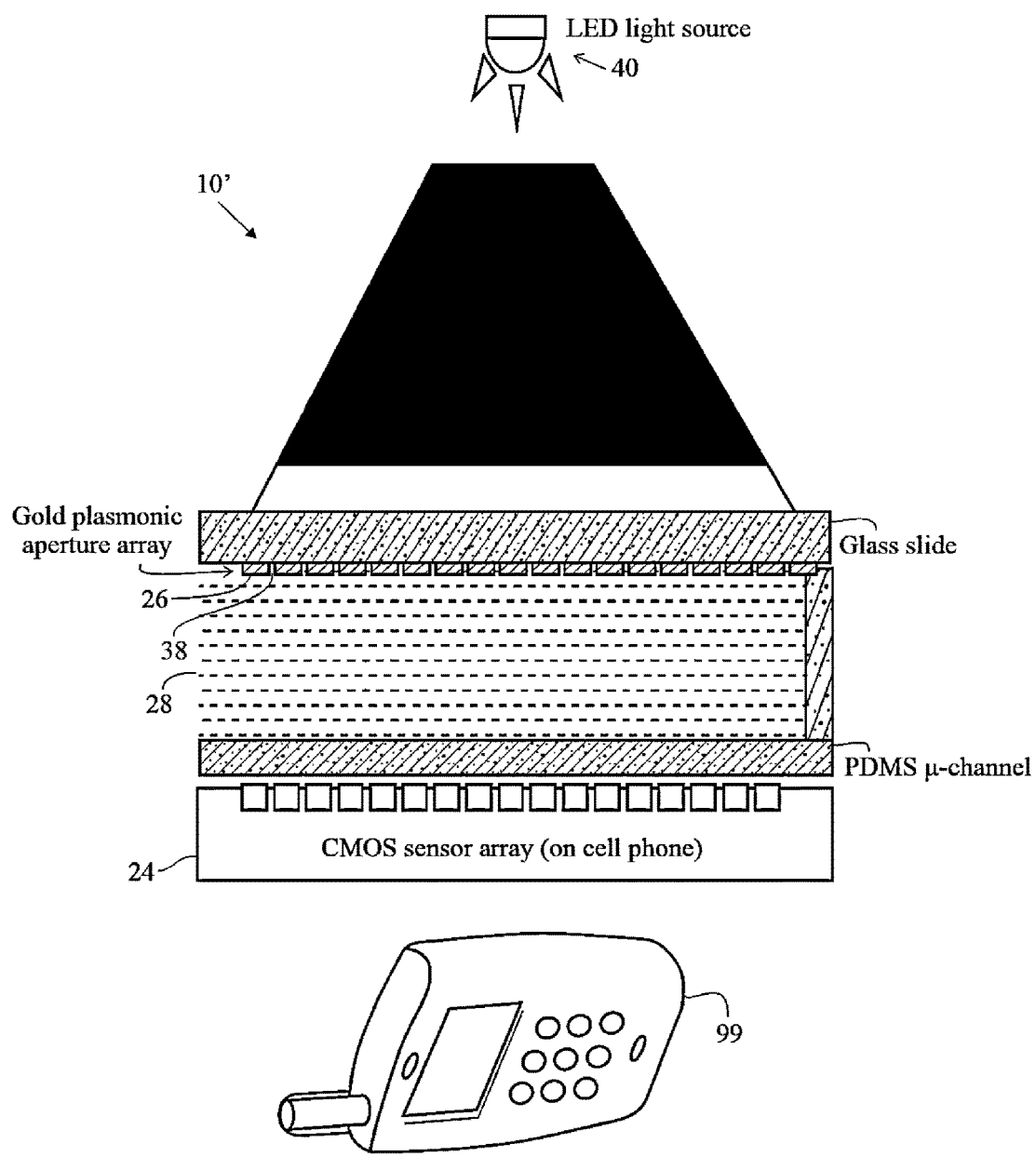
FIG. 1B is a schematic diagram of an alternative embodiment of a LF-OFM system utilizing a mobile communication device, with a LED light source and a plasmonic mask integrated to microfluidic channels.
FIG. 1C is an isolated view of an image sensor of the LF-OFM system of FIG. 1B.
FIG. 1D is a cross-sectional view of a LF-OFM system of FIG. 1B.

The present invention extends on-chip lensless microscope systems, including optofluidic microscope (OFMs)

and holographic imaging microscopes to incorporate computational photography principles. This provides a three-dimensional imaging system for improved visualization and increased throughput. Optofluidic microscope and holographic imaging microscopes are described in greater detail in: 1) X. Q. Cui, L. M. Lee, X. Heng, W. W. Zhong, P. W. Sternberg, D. Psaltis, and C. H. Yang, Proc. Natl. Acad. Sci. U.S.A., 2008, 105, 10670-10675, 2) X. Heng, D. Erickson, L. R. Baugh, Z. Yaqoob, P. W. Sternberg, D. Psaltis and C. H. Yang, Lab Chip, 2006, 6, 1274-1276, and 3) Seo, S., Su, T.-W., Tseng, D. K., Erlinger, A. and Ozcan, A., Lab Chip, 2009, 9, 777-787, all three of which are hereby incorporated by reference in its entirety.

The OFM method preferably utilizes simplified microfluidic flow to transport biological samples across a linear array of small apertures on a metal coated CMOS imaging sensor that is illuminated by a light source such as a light emitting diode ("LED") or array of LEDs. Since the passage of a sample interrupts the light transmission through the linear array of apertures, the time-varying transmission associated with each aperture represents a line trace across the biological sample. A high resolution image of the biological sample is reconstructed, at a resolution comparable to the aperture size, by reconstructing these line traces from the linear array of apertures. As explained in X. Q. Cui, L. M. Lee, X. Heng, W. W. Zhong, P. W. Sternberg, D. Psaltis and C. H. Yang, Proc. Natl. Acad. Sci. U.S.A., 2008, 105, 10670-10675, which is hereby incorporated by reference in its entirety, the diagonal arrangement of the linear aperture array and the sensor pixel size has no impact on the OFMs resolution.

To obtain an image from the OFM, the image sensor is programmed to specifically read signals from the pixels directly below the linear array of apertures. The readout rate is preferably 1.3 kHz/s. The time-varying transmission change measured through each aperture represents a line scan of a sample passing through the microfluidic channel. By stacking the line scans from the apertures together, an image of the sample can be generated.

Lensfree imaging of biological samples is also obtained using holographic imaging, where diffraction patterns of the samples over a sensor array (CMOS or CCD) are obtained. Diffraction patterns are sharpened by the use of a single aperture between the source of light and sample to be imaged. Image processing algorithms are implemented to identify the type of sample that is present over a specific area of the sensor according to the diffraction patterns obtained for each particle within the sample.

The lensless imaging and counting techniques of the OFM and the holographic systems provide a platform for accurate analysis of biological samples. Similarities between the methods include the use of one or many apertures, which are a key element in the optimization of the imaging system.

The present invention extends the functionality and usefulness of the lensless imaging systems by recording and controlling the 4D lightfield captured in the microscope image, from here on called the lightfield optofluidic and holographic microscope (LF-OFHM.) Unlike a conventional photograph, light fields permit manipulation of viewpoint and focus after the snapshot has been taken, subject to the resolution of the image sensor and the diffraction limit of the optical system. From the image captured by the LF-OFHM, one can employ light field rendering to generate oblique orthographic views and/or perspective views, at least up to the angular limit of rays that have been captured, such as disclosed in Ren N, Marc Levoy, Mathieu Bredif, Gene Duval, Mark Horowitz and Pat Hanrahan, Stanford Tech Report CTSR 2005-02, *Light Field Photography with a Hand-held Plenoptic Camera*, found at graphics.stand-ford.edu/papers/lfcamera-150 dpi.pdf, which is hereby incorporated by reference in its entirety. Since the LF-OFHM separates image acquisition from the selection of viewpoint and focus, the LF-OFHM is used as a "digital viewfinder" where focus and viewing perspective are manipulated by signal processing algorithms after the picture is taken.

The application of computer vision algorithms to these selection procedures leads to greater automation of the microscope operation when analyzing large numbers of specimens. Since microscopes normally record orthographic imagery, perspective views represent a new way to look at specimens. In addition, adaptive depth of field and spatial (perspective) views of the specimen increase sensitivity (fewer false negative results) and specificity (fewer false positives.

Starting from a captured light field, one alternatively uses synthetic aperture photography to produce views focused at different depths, as disclosed in Levoy, M. & Hanrahan, P. (1996) Light field rendering. Proc. SIGGRAPH 1996, 31-42, and Isaksen, A., McMillan, L. & Gortler, S. J. (2000) Dynamically reparameterized light fields. Proc. Siggraph 2000, 297-306, which are both incorporated by reference in their entireties. The ability to create focal stacks from a single input image allows moving or light sensitive specimens to be recorded. Finally, by applying 3D deconvolution to these focal stacks, such as disclosed in Levoy, M., Chen, B., Vaish, V., Horowitz, M., McDowall, I. & Bolas, M. (2004) Synthetic aperture confocal imaging. ACM Trans. on Graphics (Proc. SIGGRAPH) 23(3), 825-834, which is hereby incorporated by reference in its entirety, one reconstructs a stack of cross-sections, which is visualized using volume rendering, such as disclosed in Agard, D. A. (1984) Optical sectioning microscopy: cellular architecture in three dimensions. Ann. Rev. Biophys. Bioeng. 13, 191-219, which is hereby incorporated by reference in its entirety.

The extended proposed system provides a 3D visualization and analysis of a sample, with the implementation of a three-dimensional holographic imaging system. This three-dimensional technology enables a high system throughput to be achieved, where a number of different samples are imaged and analyzed in parallel.

The present invention is particularly beneficial to the development of diagnostic devices, by developing microfluidic components to perform concentration or diluting, sorting and, labeling and other preparation steps for biological samples to be analyzed. In addition to the testing of water quality, for example, a variety of disease diagnostics could be performed. Advantages over existing technologies would include accurate, rapid and cost-effective three-dimensional detection of cells without the use of lenses and other conventional laboratory-bound and bulky microscopy methods. In addition the high throughput achievable by the system would enable parallel analysis of samples, dramatically decreasing analysis time and improving the accuracy of the analysis.

As an example of fabricating an LF-OFHM, a Micron MT9T013 progressive scan CMOS image sensor is preferably used. The sensor preferably consists of a 2048×1536 pixel array, each pixel 1.75 µm×1.75 µm in size, with an imaging area of 3.61 mm×2.72 mm.

As shown in FIG. 1, the system 10 has a LED array 40, a microfluidic channel 28 with biological samples 30, a disposable chip 23, a image sensor array 24, and a layer with apertures 50.

Figure 1B:
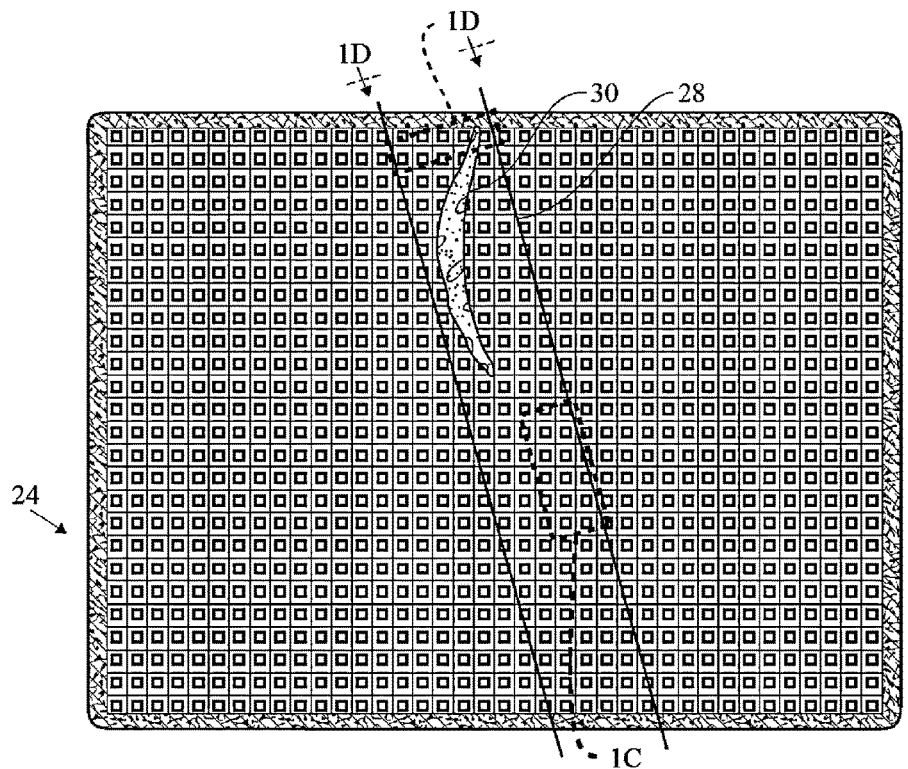

As shown in FIG. 1B, the system 10' has a light source 40, a gold layer 26 with apertures 38, a microfluidic channel 28, an image sensor array 24 and a mobile communication device 99 (a cell phone).

FIG. 1B illustrates the image sensor 24 from above with the biological sample 30 flowing through the microfluidic channel 28 at a set speed (m/s). With reference to FIG. 1B, the system 20 preferably includes an image sensor 24, a PMMA layer 32, a microfluidic channel 28, a gold layer 26, a PDMS layer 34 and an array of LEDs 40 (40a-40k). The gold layer 26 has a plurality of apertures 38.

The polymethyl methacrylate (PMMA) layer 32 of 600 nm in thickness has been preferably spin-coated to planarize a surface 24a of the image sensor 24. In the present invention, the thickness of the PMMA layer 32 is preferably thicker than normal to increase the spatial and angular resolution of the LF-OFM. The gold layer 26 is set above the microfluidic channel 28. A metal evaporator with a thermal source is utilized to deposit a 300 nm thick gold layer 26 on top of the PMMA layer 32. (At these layer thicknesses, the outlines of individual pixels are discernible under SEM imaging and the surface is sufficiently flat to allow subsequent bonding of a PDMS block containing a microfluidic channel onto the chip.) Following this step, a focused ion beam machine is used to mill arrays of apertures 38 on the gold layer 26. Then another 200 nm PMMA layer 34 is spin coated on the gold layer 26 to protect the aperture 38. The diameter of the aperture 38 is in the order of 0.7 µm. The apertures 38 are preferably spaced 12.25 µm apart (equal to 7-pixel widths). The two arrays are also spaced 12.25 µm apart. The relatively wide spacing choice is made to optimize the spatial and angular resolution of the LF-OFM system. This allows for an addressable spatial resolution during imaging of 7×7 pixels=49 tiles. This step ensures that the apertures 38 are each milled directly above a single sensor pixel by exacting good control over the milling process. Finally, a polydimethylsiloxane (PDMS) block containing a soft lithography patterned microfluidic channel is positioned onto the sensor with a mask aligner (i.e. with a Karl Suss, MJB3).

Figure 1C:
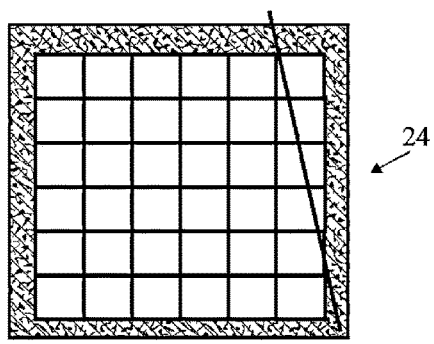
Figure 1D:
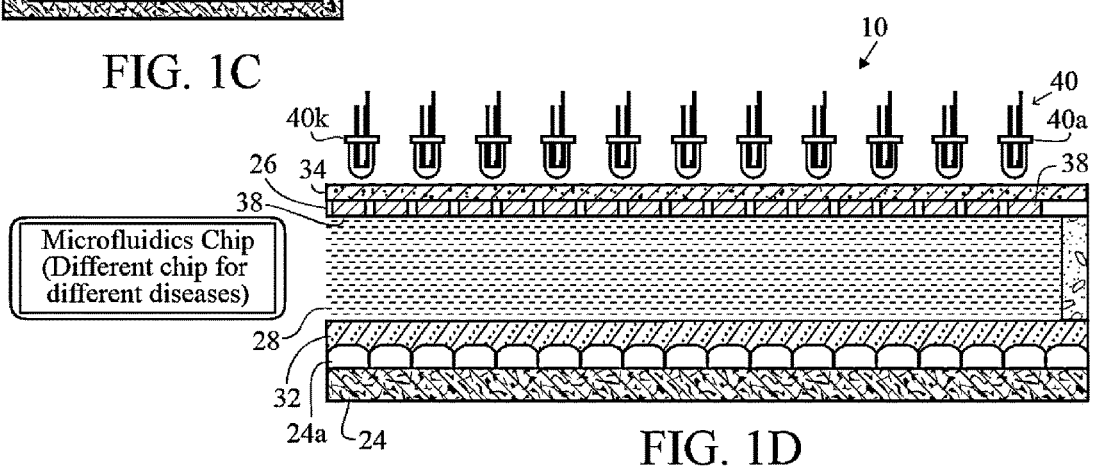

The channel 28 is preferably 35 pixels (35×1.75 µm=61.25 µm) in width and 20 µm in height. The channel width is an important parameter for the LF-OFM since this determines angular resolution. For the parameters described above, the angular resolution is preferably 35 pixels/7 pixels=5 pixels (or 8.75 µm). The channel 28 is preferably set at an angle of 3 degrees to the aperture array 20. Since the 4D lightfield is available, the array of 7 pixels×7 pixels=49 pixels underneath each of the two lines of pixels directly below the aperture array is read. As shown in FIG. 1C, the technique described effectively transforms the single pixels of the OFM to an effectively bigger pixel consisting of 49 pixels (12.25 µm×12.25 µm). The readout rate is preferably 1.3 kHz/s. The time-varying transmission change measured through each aperture 38 represents a matrix scan of a sample passing through the microfluidic channel 28. By stacking the line scans from the apertures 38 together, an image of the sample is generated.

An extension of the system described above, particularly important for mass production of the devices LF-OFM, is directed to wafer level processing. In this embodiment, a wafer of image sensors (before individual dicing of the image sensors) is processed. The whole wafer of image sensors is spin-coated with a 600 nm layer of PMMA, then a 300 nm layer of gold is evaporated on top of the PMMA layer. A focused ion beam is then used to mil arrays of apertures on the whole array on top of the image sensors. A PDMS block is then patterned to form the microfluidic channel on top of the individual image sensors. After this step, the wafer is diced and packaged.

Figure 2:
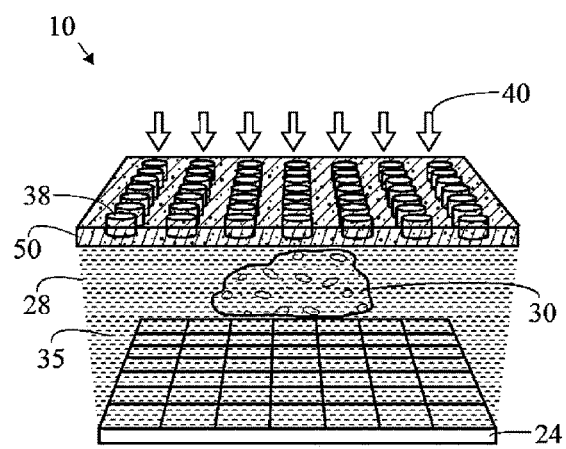
FIG. 2 is a three-dimensional schematic configuration of a unit as shown in FIG. 1.

The basic optical path of the LF-OFM system 10 is depicted in FIG. 2, which represents a side view of the system 10. The system 10 includes a image sensor 24, a channel 28 filled withwater 35 and having a specimen 30 therein. A plasmonic mask 50 has apertures 38 wherein illumination light 40 is shown through. A uniform light source is applied from above and is preferably a halogen light for experimental purposes or alternatively an LED, or array of LEDs aligned with the aperture array. The plasmonic mask design and LF-OFM working principles with the basic optical path of the LF-OFM system 10 depicted in FIG. 2, which represents a side view of the system 10. A uniform light source is applied from above and can be a halogen light for experimental purposes or an LED, or array of LEDs aligned with the aperture array.

Figures 3, 3A, 3B:
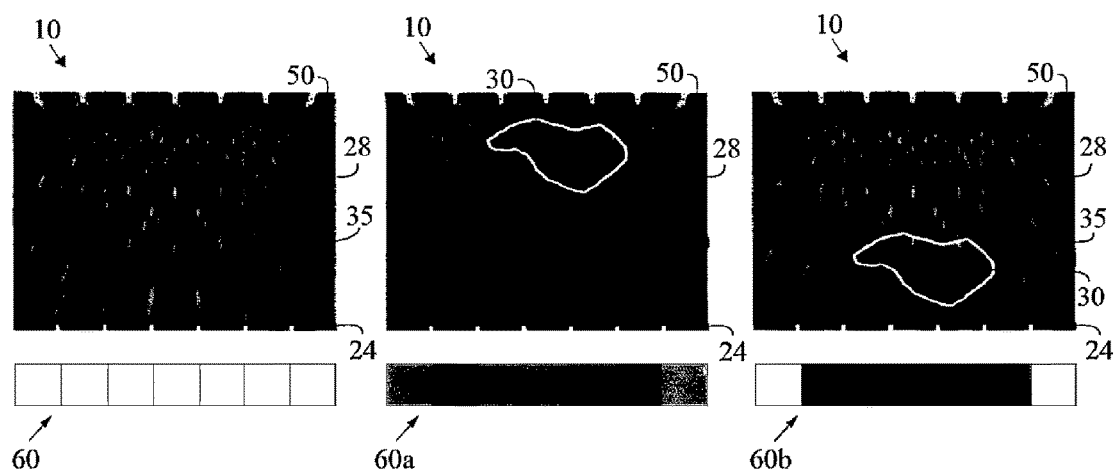
FIG. 3 is a two-dimensional illustration of the LF-OFM system upon plane wave illumination while corresponding pixelated intensities of a CMOS sensor are illustrated.
FIG. 3A is a two-dimensional illustration of the LF-OFM system upon plane wave illumination while corresponding pixelated intensities of a CMOS sensor are illustrated.
FIG. 3B is a two-dimensional illustration of the LF-OFM system upon plane wave illumination while corresponding pixelated intensities of a CMOS sensor are illustrated.

As shown in FIG. 2, in this specific case of design geometry in FIG. 1, the unit cell of the plasmonic mask 50 comprises seven apertures 38, each with 0.5 um diameter and 1.75 um center-to-center distance. The plasmonic mask 50 is preferably 300 nm thick. Upon plane wave illumination, the light field distributions under the plasmonic mask 50 are presented in FIGS. 3, 3A and 3B. Their corresponding pixelated intensities of the CMOS sensor are presented in 60, 60a, and 60b of FIGS. 3, 3A and 3B respectively. The different colors represent different intensities in 60, 60a and 60b which are used to reconstruct the 3D image of the cell. The apertures 38 are preferably spaced 12.25 µm apart (equal to 7-pixel width.) There is preferably no need to align and calibrate the aperture 38 and the pixels. It is not necessary to physically align the aperture arrays since it is possible to calibrate the LF-OFM system 10 in software.

2D numerical simulations show the working principle of the proposed LF-OFM. In this specific case, we assume the unit cell of the plasmonic mask 50 comprises of 7 holes with 0.5 um diameter and 1.75 um center-to-center distance. The mask is 300 nm thick. Upon plane wave illumination, the light field distributions under the mask are presented in FIGS. 3, 3A and 3B. Their corresponding pixelated intensities of the CMOS sensor are presented in 60, 60a and 60b respectively. The different colors represent different intensities in 60, 60a and 60b which can be used to reconstruct 3D image of the cell.

Figure 4:
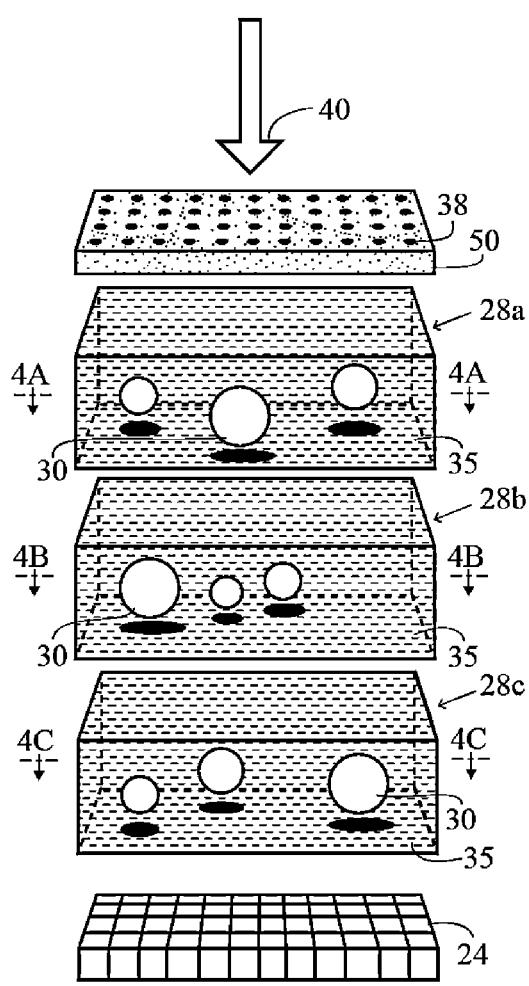
FIG. 4 is a three-dimensional schematic configuration of a multiple layer process unit for a 3D imaging and analysis.
Figure 4A:
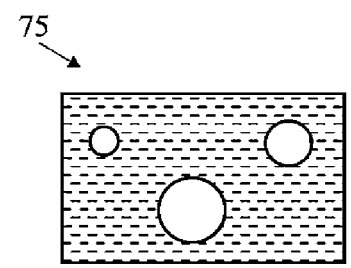
FIG. 4A is a 2D representation of layer 1 of FIG. 4.
Figure 4B:
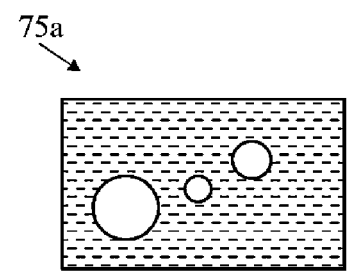
FIG. 4B is a 2D representation of layer 2 of FIG. 4.
Figure 4C:
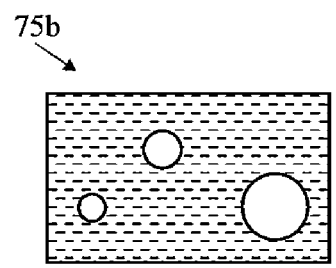
FIG. 4C is a 2D representation of layer 3 of FIG. 4.

The system is further extended to a multi-layer process for rapid and parallel processing of samples at different depths, as shown in FIGS. 4, 4A, 4B and 4C. This multidimensional aspect of the technology enables a high throughput system to be achieved for accurate and rapid analysis of samples to be performed. Each microfluidic channel 28a, 28b and 28c has water 35 with biological specimens 30. Images 75,75a and 75b of samples for each layer are shown in FIGS. 4A, 4B and 4C Similar to the image reconstruction method using computational photography used in Levoy, M. (1988) Display of surfaces from volume data. Comp. Graphics App. 8(3), 29-37 for conventional optical microscopes, in one embodiment the present invention first finds the mapping from pixels to aperture array, and from there the positions and directions of imaging rays.

The entire calibration procedure, including image capture, is done very quickly and effectively in software.

The system can further be extended to a multi-layer process for rapid and parallel processing of samples at different depths. This multidimensional aspect of the technology will enable a high throughput system to be achieved for accurate and rapid analysis of samples to be performed.

Figure 5:
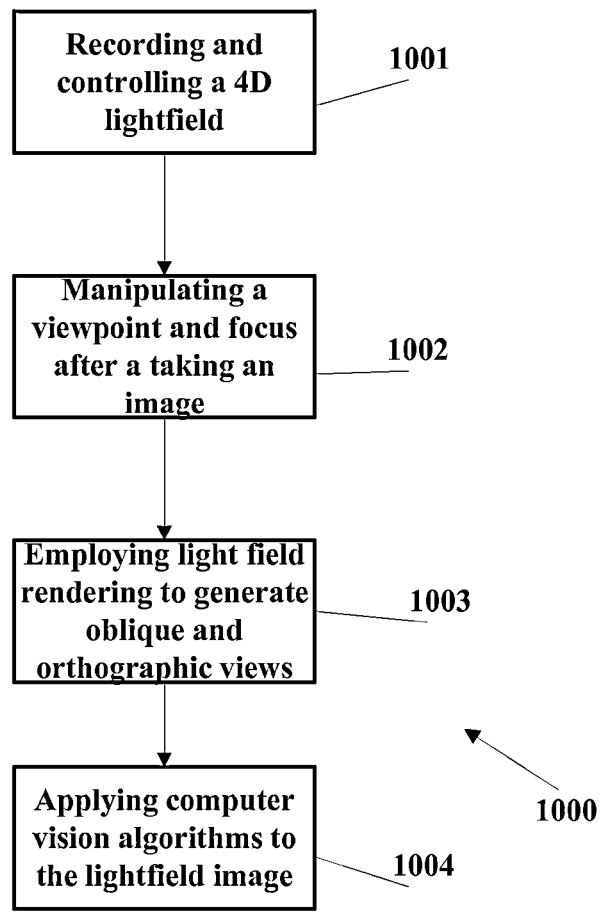
FIG. 5 is flow chart of a method for using 4D lightfield.

FIG. 5 is a method 1000 for using a 4D lightfield. The method begins at block 1001 by recording and controlling the 4D lightfield captured in an optofluidic microscope. The method also includes at block 1002 capturing light fields to permit manipulation of viewpoint and focus after the snapshot has been taken. The method also includes at block 1003 employing light field rendering to generate oblique orthographic views and/or perspective views. The method also includes at block 1004 applying computer vision algorithms to the lightfield image to provide greater automation of microscope operation when analyzing a large numbers of specimens. The adaptive depth of field and spatial (perspective) views of the specimen increases sensitivity (fewer false negative results) and specificity (fewer false positives). Image reconstruction using computational photography: Similar to the method used for conventional optical microscopes, it is possible to first find the mapping from pixels to aperture array, and from there the positions and directions of imaging rays. The entire calibration procedure, including image capture, can be done very quickly and effectively in software.

Figure 6:
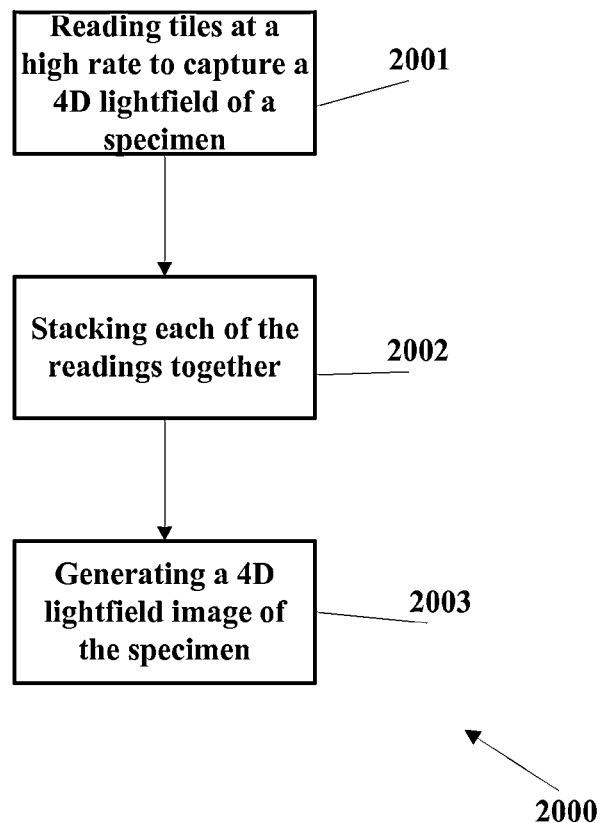
FIG. 6 is a flow chart of a method for generating a 4D lightfield image.

FIG. 6 is a flow chart of a method 2000 for generating a 4D lightfield image. The method includes at block 2001 reading a plurality of tiles at a high rate to capture a 4D lightfield of a biological specimen flowing in a microfluidics channel. The method also includes at block 2002 stacking each of the plurality of tile readings together. The method also includes at block 2003 generating a 4D lightfield image of the biological specimen.

Figure 7:
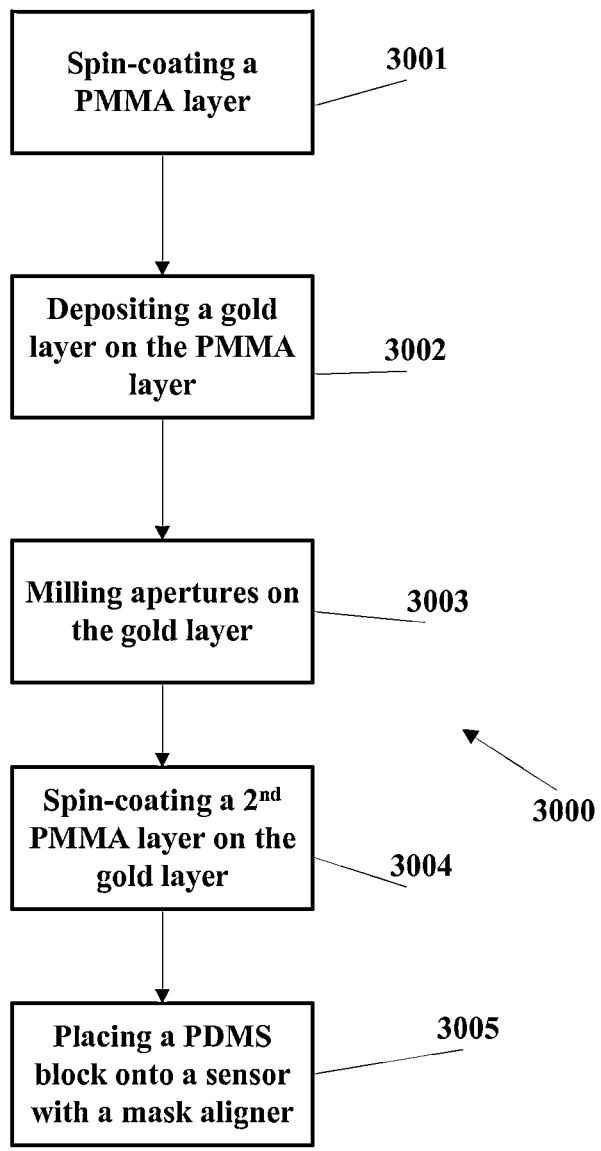
FIG. 7 is a flow chart of a method for fabricating an LF-OFHM.

FIG. 7 is a flow chart of a method 3000 for fabricating an LF-OFHM. The method includes at block 3001 spin-coating a polymethyl methacrylate (PMMA) layer having a thickness of at least 600 nm to planarize a surface of a progressive scan CMOS image sensor having a 2048×1536 pixel array, with each pixel 1.75 μm×1.75 μm in size, with an imaging area of 3.61 mm×2.72 mm. The method also include at block 3002 depositing at least a 300 nm thick gold layer on top of the PMMA layer with a metal evaporator with a thermal source. The method also include at block 3003 milling arrays of apertures on the gold layer using a focused ion beam machine. The method also include at block 3004 spin-coating a 200 nm PMMA layer on the gold layer to protect the aperture, wherein a diameter of the aperture is at least 0.7 μm, and each of the apertures is spaced 12.25 μm apart. The method also include at block 3005 placing a polydimethylsiloxane (PDMS) block containing a soft lithography patterned microfluidic channel onto the sensor with a mask aligner.

Figure 8:
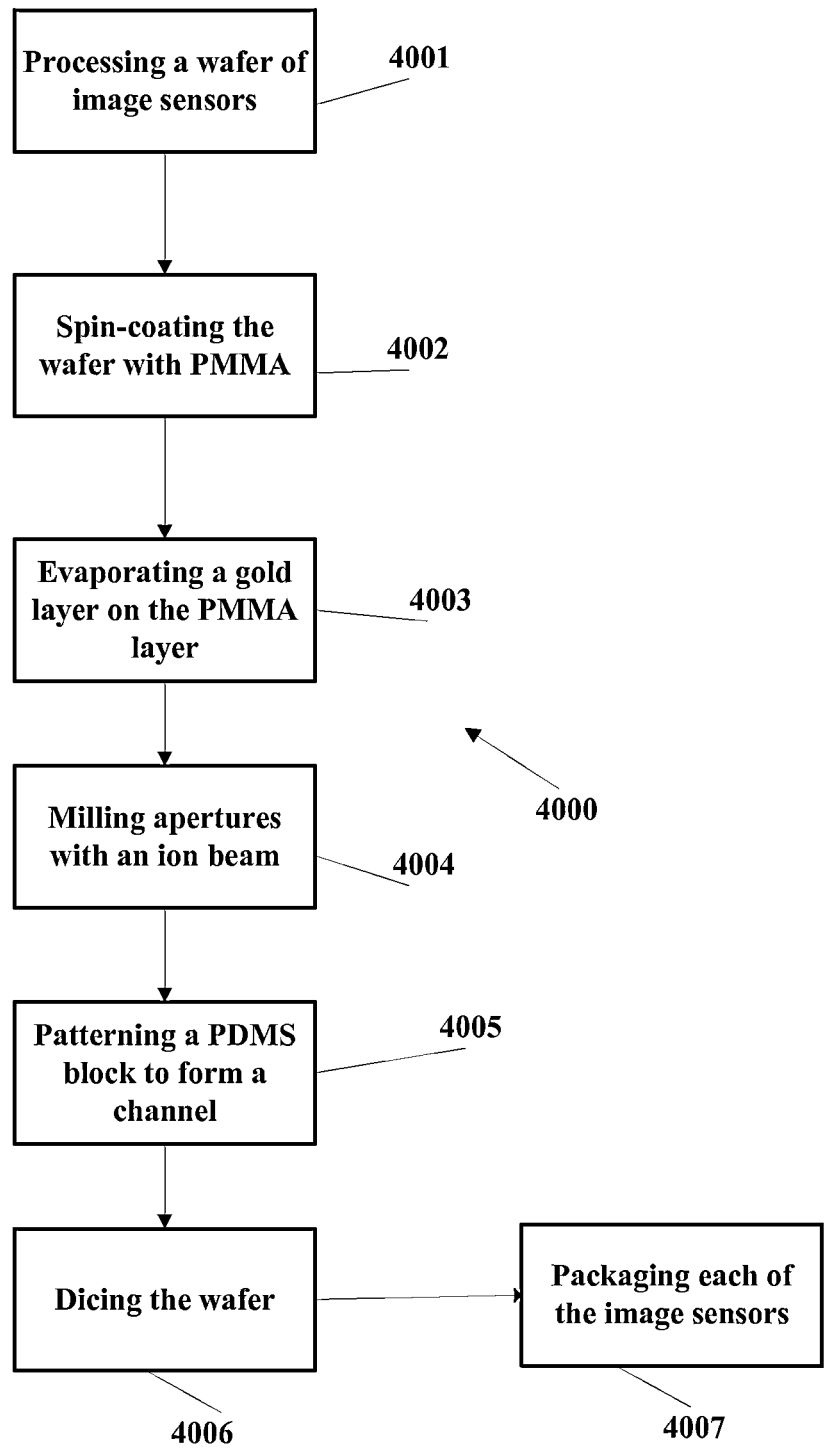
FIG. 8 is a flow chart of a method for fabricating an LF-OFHM.

FIG. 8 is a flow chart of a method 4000 for fabricating an LF-OFHM. The method includes at block 4001 processing a wafer of a plurality of image sensors. The method includes at block 4002 spin-coating the wafer of a plurality of image sensors with a 600 nm layer of PMMA. The method includes at block 4003 evaporating a 300 nm layer of gold on top of the PMMA layer. The method includes at block 4004 milling arrays of apertures on a whole array on the top of the image sensors using a focused ion beam. The method includes at block 4005 patterning a PDMS block to form a microfluidic channel on the top of each of the individual image sensors. The method includes at block 4006 dicing the wafer. The method includes at block 4007 packaging each of the image sensors.

The invention claimed is:

1. An on-chip light field optofluidic microscope system comprising:
a plurality of plasmonic lenses;
at least one microfluidic device;
a complementary metal-oxide semiconductor image sensor array or a CCD sensor array;
wherein the system is capable of generating a plurality of three-dimensional images utilizing a 4D lightfield through computational photography techniques.

2. The system according to claim 1, wherein said computational photography techniques comprise holographic reconstruction of images.

3. The system according to claim 2, wherein a hologram is a record of an interaction of two beams of coherent light in the form of microscopic pattern of interference fringes.

4. The system according to claim 2, wherein a hologram is a photographic registration of an interference pattern formed by two light sources of coherent light wherein one beam goes straight from the light source and the second beam is scattered from a physical objection.

5. The system according to claim 2, wherein combining a hologram with light field principles provides for a full investigation of a three-dimensional volume from a multitude of viewing angles.

6. The system according to claim 2, wherein a holographic image depends on wave phenomena.

7. The system according to claim 1, wherein an image sensor is exposed by two light sources and is processed to produce a three-dimensional image when illuminated.

8. The system according to claim 7 wherein a three-dimensional object is captured in z-space with a hologram.

9. The system according to claim 1, wherein the system is adapted for lensfree imaging.

10. An on-chip light field optofluidic microscope system comprising:
at least one plasmonic lens;
at least one microfluidic device; and
an image sensor array;
wherein the system is configured to capture a 4D light field and is capable of generating an image through computational photography techniques.

11. The system according to claim 10 further comprising a mobile communication device comprising a camera, wherein the mobile communication device is attached to the image sensor array to utilize the camera of the mobile communication device for personal diagnostic applications.

12. The system according to claim 10 wherein the image sensor array is a complementary metal-oxide semiconductor image sensor array or a CCD sensor array.

13. The system according to claim 10 wherein the image is a 3D image.

14. A method for using 4D lightfield, the method comprising:
transporting a biological sample across a linear array of a plurality of apertures on an imaging sensor, wherein the imaging sensor is illuminated with light from a light source;
interrupting the transmission of light from the light source as the biological sample transports across the linear array to generate a plurality of line traces, wherein a time-varying transmission associated with each aperture of the plurality of apertures represents a line trace across the biological sample; and
constructing an image of the biological sample at a resolution comparable to the size of each aperture of the plurality of apertures by reconstructing the plurality of line traces from the linear array of apertures.

15. The method according to claim 14 wherein the light source is an array of LEDs.

16. The method according to claim 14 wherein an image sensor is programmed to read signals from a plurality of pixels directly below the linear array of apertures.

17. The method according to claim 14 wherein constructing the image of the biological sample comprises stacking the plurality of line scans from the plurality of apertures.

18. A method for using 4D lightfield, the method comprising:
recording and controlling the 4D lightfield captured in an optofluidic microscope;
manipulating viewpoint and focus subsequent to a snapshot;
employing light field rendering to generate a plurality of oblique orthographic views and a plurality of perspective views; and
applying computer vision algorithms to the lightfield image.

19. A method for generating a 4D lightfield image, the method comprising:
reading a plurality of tiles at a high rate to capture a 4D lightfield of a biological specimen flowing in a microfluidics channel;
stacking each of the plurality of tile readings together; and
generating a 4D lightfield image of the biological specimen.

20. An on-chip light field optofluidic microscope system comprising:
an array of a plurality of LEDs;
a layer of gold having a thickness ranging from 250 nm to 350 nm and having a plurality of apertures therethrough;
a layer of polydimethylsiloxane (PDMS) disposed on the layer of gold, the layer of PDMS having a thickness ranging from 150 nm to 250 nm;
a micro fluidic channel having a height ranging from 15 microns to 25 microns and a width ranging from 50 microns to 65 microns;
a layer of polymethyl methacrylate (PMMA) having a thickness ranging from 500 nm to 700 nm; and
an image sensor array;
wherein the system is capable of generating an image through computational photography techniques.

* * * * *